(12) United States Patent
Qi et al.

(10) Patent No.: US 12,018,973 B2
(45) Date of Patent: Jun. 25, 2024

(54) MAGNETIC LEVEL GAUGE

(71) Applicant: MultiDimension Technology Co., Ltd., Zhangjiagang (CN)

(72) Inventors: Bin Qi, Zhangjiagang (CN); Songsheng Xue, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 191 days.

(21) Appl. No.: 17/753,201

(22) PCT Filed: Aug. 18, 2020

(86) PCT No.: PCT/CN2020/109715
§ 371 (c)(1),
(2) Date: Feb. 23, 2022

(87) PCT Pub. No.: WO2021/036859
PCT Pub. Date: Mar. 4, 2021

(65) Prior Publication Data
US 2022/0276085 A1    Sep. 1, 2022

(30) Foreign Application Priority Data

Aug. 23, 2019 (CN) .......................... 201910785398.7

(51) Int. Cl.
*G01B 7/14*  (2006.01)
*G01F 23/72*  (2006.01)
*G01R 33/09*  (2006.01)

(52) U.S. Cl.
CPC ........... *G01F 23/72* (2013.01); *G01R 33/091* (2013.01); *G01R 33/093* (2013.01); *G01R 33/096* (2013.01); *G01R 33/098* (2013.01)

(58) Field of Classification Search
CPC .. G01R 33/091; G01R 33/093; G01R 33/096; G01R 33/098; G01R 33/246;
(Continued)

(56) References Cited

U.S. PATENT DOCUMENTS 5,686,894 A * 11/1997 Vig .................. G01D 5/145
377/21
2002/0005715 A1 * 1/2002 Sato .................. G01D 5/145
324/207.2
(Continued)

FOREIGN PATENT DOCUMENTS

CN        87203326 U     7/1988
CN        2121681 U     11/1992
(Continued)

OTHER PUBLICATIONS

"Chinese Application No. 201910785398.7, First Office Action dated May 25, 2020", (dated May 25, 2020), 7 pgs.
(Continued)

*Primary Examiner* — Thang X Le
(74) *Attorney, Agent, or Firm* — Schwegman Lundberg & Woessner, P.A.

(57) ABSTRACT

A wall-mounted magnetic level gauge for material storage containers, the magnetic level gauge comprises: A magnetic displacement assembly, which is located on the sidewall of the material storage container and generates a mechanical displacement in response to the level of a material in the material storage container. It further includes a magnetic sensor assembly, comprising a protective housing, a magnetoresistive chip, and a processing module located within the protective housing. The protective housing is fixed on the side wall of the material storage container. The magnetoresistive chip is located at a side of the processing module facing a magnet displacement assembly. The magnetic sensor assembly is used to sense a magnetic field produced by the magnet displacement assembly to determine the level of the material in the material storage container. The magnet displacement assembly displaces the magnet according to the level of the material. The magnetoresistive chip senses a magnetic field change of the magnet displacement assembly
(Continued)

to determine the level of the material accordingly. The magnetic level gauge has the advantages of simple structure, low power consumption, high sensitivity, and low cost. It is suitable for the solid and liquid material measurement.

10 Claims, 10 Drawing Sheets

(58) Field of Classification Search
CPC ........ G01R 27/04; G01R 27/06; G01D 5/202; G01D 5/485; G01D 5/48; G01D 5/12; G01D 5/20
See application file for complete search history.

(56) References Cited

U.S. PATENT DOCUMENTS

| | | | | |
|---|---|---|---|---|
| 2004/0050156 | A1* | 3/2004 | Nicolazo De Barmon | C03B 5/245 |
| | | | | 73/290 R |
| 2012/0038352 | A1* | 2/2012 | Elian | G01R 33/072 |
| | | | | 324/156 |
| 2014/0020464 | A1* | 1/2014 | Farmanyan | G01F 23/38 |
| | | | | 73/313 |
| 2015/0330828 | A1* | 11/2015 | Colvin, Jr. | G01F 23/38 |
| | | | | 702/55 |
| 2015/0355014 | A1* | 12/2015 | Deak | G01F 23/62 |
| | | | | 73/313 |
| 2017/0102261 | A1* | 4/2017 | Payne | G01F 23/802 |
| 2017/0319374 | A1* | 11/2017 | Hu | A61F 5/4407 |
| 2019/0063979 | A1 | 2/2019 | Jackson et al. | |

FOREIGN PATENT DOCUMENTS

| | | |
|---|---|---|
| CN | 2363272 Y | 2/2000 |
| CN | 1707231 A | 12/2005 |
| CN | 201025449 Y | 2/2008 |
| CN | 102155968 A | 8/2011 |
| CN | 102326056 A | 1/2012 |
| CN | 202276571 U | 6/2012 |
| CN | 108871491 A | 11/2018 |
| CN | 208780296 U | 4/2019 |
| CN | 110440872 A | 11/2019 |
| JP | 4724105 B2 | 4/2011 |
| JP | 5353944 B2 | 9/2013 |
| WO | WO-2021036859 A1 | 3/2021 |

OTHER PUBLICATIONS

"Chinese Application No. 201910785398.7, First Search dated May 18, 2020", (dated May 18, 2020), 2 pgs.

"Chinese Application No. 201910785398.7, Notification to Grant Patent Right for Invention dated Dec. 30, 2020", (dated Dec. 30, 2020), 2 pgs.

"International Application No. PCT/CN2020/109715, International Search Report and Written Opinion dated Nov. 25, 2020", (dated Nov. 25, 2020), 10 pgs.

* cited by examiner

MAGNETIC LEVEL GAUGE

PRIORITY CLAIM TO RELATED APPLICATIONS

This application is a U.S. national stage filing under 35 U.S.C. § 371 from International Application No. PCT/CN2020/109715, filed on 18 Aug. 2020, and published as WO2021/036859 on 4 Mar. 2021, which claims the benefit under 35 U.S.C. 119 to Chinese Application No. 201910785398.7, filed on 23 Aug. 2019, the benefit of priority of each of which is claimed herein, and which applications and publication are hereby incorporated herein by reference in their entirety.

FIELD OF THE INVENTION

Embodiments of the present invention relates to warehousing detection technologies, and more particularly, to a magnetic level gauge for detecting the level of a material in a material storage container.

DESCRIPTION OF THE RELATED ART

Level gauges are used for detecting the level of a material. Existing level gauges include those of the rotating paddle type, diaphragm type, tuning fork type, vibrating rod type, and radio frequency admittance type. A rotating paddle level gauge uses a motor to drive a paddle, and when the paddle is in contact with the material, the motor stops rotation and outputs a signal; a diaphragm level gauge transmits, via a lever mechanism, its own deformation signal to a microswitch to trigger an action; a tuning fork level gauge outputs a signal based on a change to the vibration frequency when the tuning fork is immersed; a vibrating rod level gauge triggers a signal as the vibration damping is increased when the vibrating rod level gauge is covered by the material; and a radio frequency admittance level gauge uses a radio wave to measure changes to the admittance value as the level changes, and then triggers and outputs a signal.

However, rotating paddle level gauges have low costs, diaphragm level gauges have low sensitivity, tuning fork level gauges have high power consumption, vibrating rod level gauges have high power consumption, low sensitivity, and high costs, and radio frequency admittance level gauges have high power consumption.

SUMMARY OF THE INVENTION

Embodiments of the present invention provide a magnetic level gauge, which lowers the power consumption and improves the sensitivity of existing level gauges.

A magnetic level gauge according to the embodiments of the present invention is mounted on a side wall of a material storage container, the magnetic level gauge comprising:
 a magnetic displacement assembly, which is used to generate a mechanical displacement to a side wall of the material storage container in response to the level of a material in the material storage container;
 a magnetic sensor assembly, comprising a protective housing, as well as a magnetoresistive chip and a processing module that are located within the protective housing, wherein the protective housing is fixed on the side wall of the material storage container, the magnetoresistive chip is located at a side of the processing module facing the magnetic displacement assembly, and the magnetic sensor assembly is used to sense a magnetic field signal of the magnetic displacement assembly and to determine the level of the material in the material storage container according to the magnetic field signal.

Furthermore, the magnetic displacement assembly comprises a spring sheet and a permanent magnetic material;
 the permanent magnetic material is a permanent magnetic material block and fixed to the surface of a side of the spring sheet facing the magnetic sensor assembly; or
 the permanent magnetic material is a permanent magnetic material layer and attached to the surface of a side of the spring sheet facing the magnetic sensor assembly; or
 the permanent magnetic material is a permanent magnetic material powder and evenly distributed inside the spring sheet;
 wherein the magnetizing direction of the permanent magnetic material is perpendicular or parallel to the plane where the spring sheet is on, and the magnetoresistive chip is located on the maximum displacement path of the permanent magnetic material.

Furthermore, the permanent magnetic material adopts a multi-layer thin-film composite unit formed by one hard magnetic material or a variety of hard magnetic materials; or the permanent magnetic material adopts a multi-layer thin-film composite material of [a soft magnetic material/a hard magnetic material]n, wherein n is a natural number.

Furthermore, the magnetic displacement assembly further comprises a protective coating encapsulating the spring sheet and the permanent magnetic material.

Furthermore, the material storage container comprises a bottom surface, and the spring sheet comprises a first end close to the bottom surface of the material storage container and a second end away from the bottom surface of the material storage container;
 the first end of the spring sheet is fixed to a first fixing point via a first support member, and the first support member is a rigid support member or an elastic support member; or the first end of the spring sheet is fixed to the first fixing point; wherein the first fixing point is located on the protective housing or located on a side wall of the material storage container.

Furthermore, the second end of the spring sheet is fixed to a second fixing point via a second support member, the second support member is a rigid support member or an elastic support member, and the second fixing point is located on the protective housing or located on a side wall of the material storage container.

Furthermore, the processing module comprises a signal processing unit and a circuit board, wherein the circuit board is fixed inside the protective housing, the magnetoresistive chip is arranged on the surface of a side of the circuit board facing the magnetic displacement assembly, and the signal processing unit is arranged on the surface of a side of the circuit board;
 the magnetoresistive chip is used to sense a magnetic field signal of the magnetic displacement assembly; and
 the signal processing unit is used to obtain the magnetic field signal, determine the level of the material in the material storage container according to the magnetic field signal, and then output a level signal of the material.

Furthermore, the plane where the magnetoresistive chip is on is perpendicular to the tangent plane at the highest point of the top surface of the protective housing, the sensitive direction of the magnetoresistive chip is located on the plane where the magnetoresistive chip is on, and the sensitive direction of the magnetoresistive chip is parallel or perpendicular to the tangent plane at the highest point of the top surface of the protective housing; or the plane where the magnetoresistive chip is on is parallel to the tangent plane at the highest point of the top surface of the protective housing, the sensitive direction of the magnetoresistive chip is located on the plane where the magnetoresistive chip is on, and the sensitive direction of the magnetoresistive chip is parallel to the tangent plane at the highest point of the top surface of the protective housing.

Furthermore, the magnetoresistive chip is any one of an anisotropic magnetoresistive chip, a giant magnetoresistive chip, and a tunnel junction magnetoresistive chip.

With the magnetic level gauge according to the embodiments of the present invention, the magnetic displacement assembly generates a mechanical displacement according to the level of the material, which then causes the magnetic field between the magnetic displacement assembly and the magnetic sensor assembly to change, and the magnetic sensor assembly determines the level of the material according to the change to the magnetic field between the magnetic sensor assembly and the magnetic displacement assembly, wherein the magnetoresistive chip is characterized by high sensitivity and low power consumption, which favors the high-precision detection of the level of a stored material. Compared with the prior art, the protective housing isolates the magnetoresistive chip from the material in the embodiments of the present invention, which prevents electric conductivity between the material and the magnetoresistive chip, and the protective housing further results in high abrasion resistance of the magnetic sensor assembly. The magnetic displacement assembly is in direct contact with the material and may cause mechanical position changes along with the material, but will not be impacted by the dielectric constant of the material. In addition, the magnetoresistive chip in the magnetic sensor assembly has low power consumption and high sensitivity, leading to a simple structure and low cost of the overall magnetic level gauge, which is suitable for detection of solid and liquid materials, such as blocks, particles, and liquids. The magnetic level gauge has good adaptability to materials, is simple in installation, is highly reliable, and does not tend to cause a material to be stuck or blocked.

BRIEF DESCRIPTION OF THE DRAWINGS

To more clearly describe technical solutions of the embodiments of the present invention or in the prior art, the accompanying drawings to be used in the description of the embodiments or the prior art will be briefly described below. Apparently, the accompanying drawings described below are some embodiments of the present invention, and to a person of ordinary skill in the art, other drawings may be obtained according to these drawings without involving inventive skill.

DETAILED DESCRIPTION OF THE INVENTION

To make the objectives, technical solutions, and advantages of the present invention clearer, the technical solutions of the present invention will be clearly and completely described through implementation manners and with reference to the accompanying drawings in the embodiments of the present invention. Apparently, the described embodiments are part of, not all, the embodiments of the present invention. All the other embodiments obtained by a person of ordinary skill in the art based on the embodiments of the present invention without involving inventive skill shall be encompassed by the protection scope of the present invention.

Figure 1:
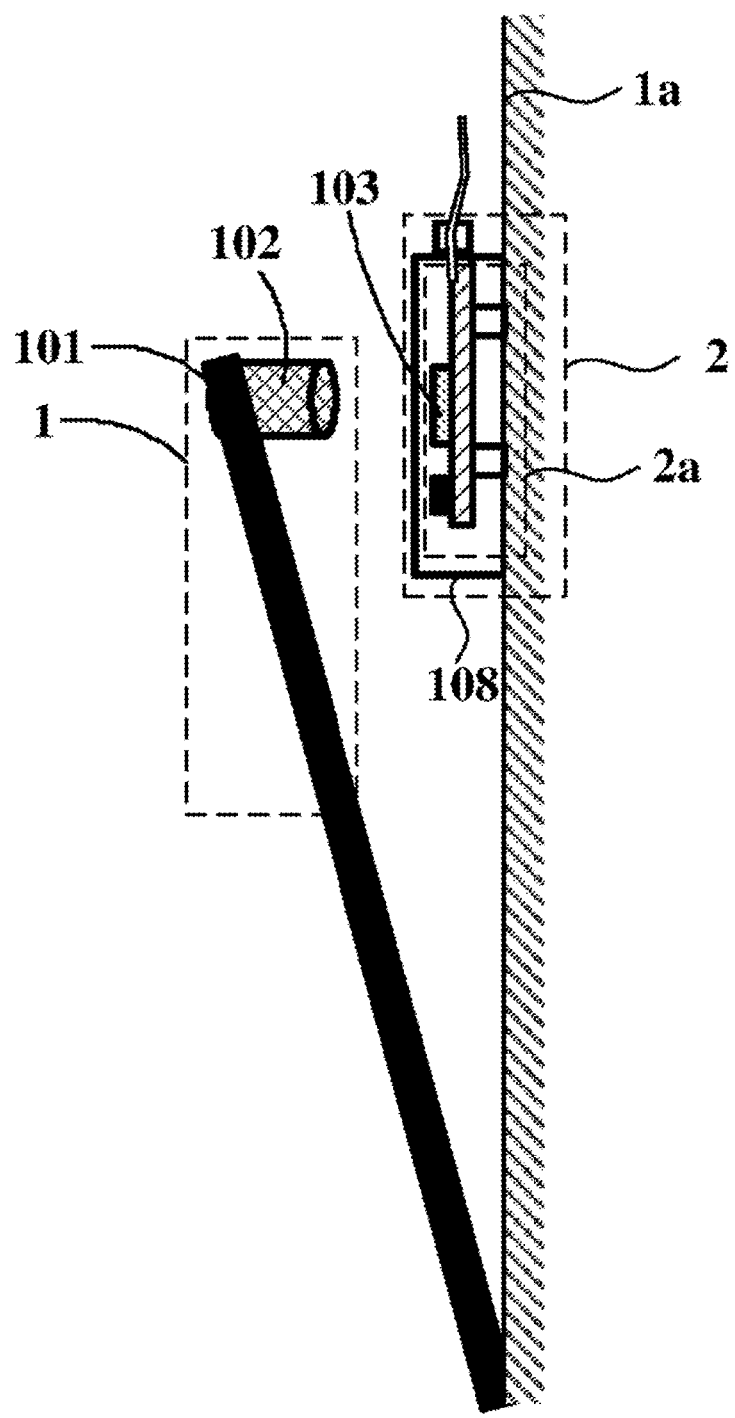
FIG. 1 is a schematic diagram of a magnetic level gauge according to an embodiment of the present invention.
Figure 2:
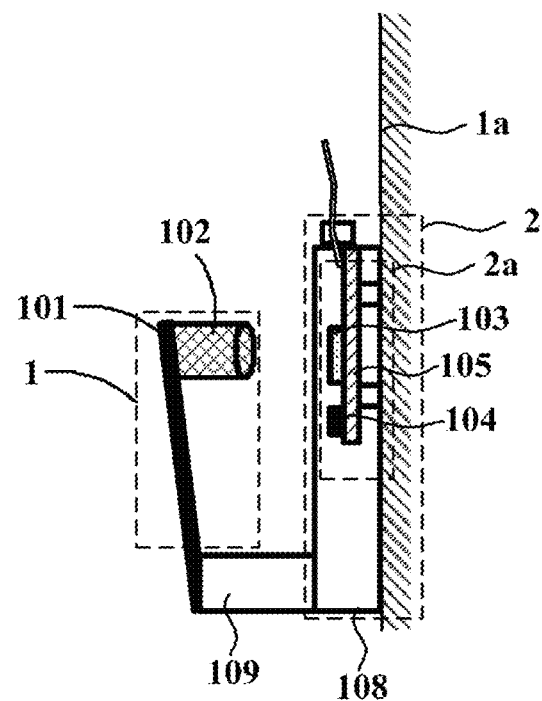
FIG. 2 is a schematic diagram of a magnetic level gauge according to an embodiment of the present invention.

Referring to FIG. 1 and FIG. 2, schematic diagrams of a magnetic level gauge according to an embodiment of the present invention are illustrated. The magnetic level gauge according to the embodiments of the present invention is mounted on a side wall of a material storage container, and can be used for measuring the storage level of a material, such as a particulate matter, a powder, a slurry, or a liquid, in the material storage container and the position of a liquid interface.

The magnetic level gauge according to the present embodiment comprises: a magnetic displacement assembly 1, the magnetic displacement assembly 1 being used to generate a mechanical displacement to a side wall 1a of the material storage container in response to the level of the material in the material storage container; a magnetic sensor assembly 2, the magnetic sensor assembly 2 comprising a protective housing 108, as well as a magnetoresistive chip 103 and a processing module 2a that are located within the protective housing 108, wherein the protective housing 108 is fixed on the side wall 1a of the material storage container, the magnetoresistive chip 103 is located at a side of the processing module 2a facing the magnetic displacement assembly 1, and the magnetic sensor assembly 2 is used to sense a magnetic field signal of the magnetic displacement assembly 1 and to determine the level of the material in the material storage container according to the magnetic field signal.

In the present embodiment, the magnetic displacement assembly 1 may be directly fixed onto the side wall 1*a* of the material storage container, while the magnetic displacement assembly 1 may also be fixed onto the side wall 1*a* of the material storage container by means of a support member as shown in FIG. 2, wherein the magnetic sensor assembly 2 is directly fixed onto the side wall 1*a* of the material storage container. It can be appreciated that the work principle of the magnetic level gauge is as follows: the magnetic displacement assembly 1 generates a corresponding mechanical displacement in response to the level of the material, and the displacement of the magnetic displacement assembly 1 causes the relative distance between the magnetic displacement assembly 1 and the magnetoresistive chip 103 to change; the magnetoresistive chip 103 senses a magnetic field signal between the magnetoresistive chip 103 and the magnetic displacement assembly 1, and the processing module 2*a* determines the level of the material in the material storage container according to the magnetic field information. It can be seen that the signal conversion process of the magnetic level gauge is as follows: the magnetic displacement assembly 1 converts material level information to mechanical displacement information, the magnetoresistive chip 103 converts the mechanical displacement information to magnetic field information, and the processing module 2*a* then converts the magnetic field information to the material level information.

It can be appreciated that the magnetic level gauge comprises the magnetic displacement assembly 1 and the magnetic sensor assembly 2, and then the mounting positions of these two assemblies should be able to achieve the detection function of the magnetic level gauge, which are not specifically limited herein.

The magnetic displacement assembly 1 is capable of generating a mechanical displacement to the side wall 1*a* in response to the level of the material in the material storage container. Specifically, the material in the material storage container can result in a pressure on the magnetic displacement assembly 1, causing the magnetic displacement assembly 1 to displace to the direction of the magnetic sensor assembly 2, wherein different levels of the material in the material storage container result in different pressures on the magnetic displacement assembly 1, and corresponding displacements of the magnetic displacement assembly 1 are also different in magnitude. Therefore, the magnetic displacement assembly 1 generates a corresponding displacement in response to the level of the material, causing the relative distance between the magnetic displacement assembly 1 and the magnetic sensor assembly 2 to change correspondingly.

In the present embodiment, the magnetic sensor assembly 2 comprises the protective housing 108, as well as the magnetoresistive chip 103 and the processing module 2*a* that are located within the protective housing 108, wherein the protective housing 108 is fixed on the side wall 1*a* of the material storage container, the magnetoresistive chip 103 is located at the side of the processing module 2*a* facing the magnetic displacement assembly 1. The protective housing 108 can isolate the magnetoresistive chip 103 therein from the material, thereby preventing the magnetoresistive chip 103 and the processing module 2*a* from being damaged. The magnetic displacement assembly 1 and the magnetic sensor assembly 2 are both arranged on the side wall 1*a* of the material storage container, and specifically, the magnetoresistive chip 103 is located on the maximum displacement path of the magnetic displacement assembly 1. Then, the displacement of the magnetic displacement assembly 1 causes the magnetic field between the magnetic displacement assembly 1 and the magnetoresistive chip 103 to change, and the magnetoresistive chip 103 located on the maximum displacement path of the magnetic displacement assembly 1 can sense a magnetic field signal between the magnetoresistive chip 103 and the magnetic displacement assembly 1. The magnetoresistive chip 103 converts the sensed magnetic field signal to a change to a magnetic resistance value, and the processing module 2*a* determines the level of the material in the material storage container according to the magnetic resistance value signal.

It can be appreciated that the structure of the magnetic displacement assembly 1 is optionally any structure combining magnetic and elastic functions, for example, a magnetic spring sheet. The magnetoresistive chip 103 in the magnetic sensor assembly 2 is optionally any magnetoresistive sensor capable of detecting magnetic field signals, which is not specifically limited herein. The protective housing 108 is optionally a non-magnetic material, specifically a metal, ceramics, glass, quartz, or a composite material, which prevents the protective housing 108 from affecting the mechanical displacement of the magnetic displacement assembly 1.

With the magnetic level gauge according to the present embodiment, the magnetic displacement assembly generates a mechanical displacement according to the level of the material, which then causes the magnetic field between the magnetic displacement assembly and the magnetic sensor assembly to change, and the magnetic sensor assembly determines the level of the material according to the change to the magnetic field between the magnetic sensor assembly and the magnetic displacement assembly, wherein the magnetoresistive chip of the magnetic sensor assembly is characterized by high sensitivity and low power consumption, which favors the high-precision detection of the level of a stored material. Compared with the prior art, the protective housing isolates the magnetoresistive chip from the material in the present embodiment, which prevents electric conductivity between the material and the magnetoresistive chip, and the protective housing further results in high abrasion resistance of the magnetic sensor assembly. The magnetic displacement assembly is in direct contact with the material and may cause mechanical position changes along with the material, but will not be impacted by the dielectric constant of the material. In addition, the magnetoresistive chip in the magnetic sensor assembly has low power consumption and high sensitivity, leading to a simple structure and low cost of the overall magnetic level gauge, which is suitable for detection of solid and liquid materials, such as blocks, particles, and liquids. The magnetic level gauge has good adaptability to materials, is simple in installation, is highly reliable, and does not tend to cause a material to be stuck or blocked.

Figure 3:
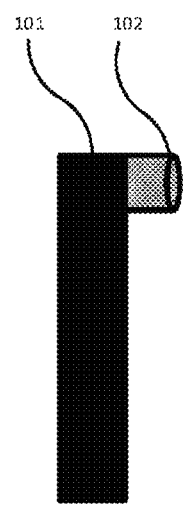
FIG. 3 is a schematic diagram of a magnetic displacement assembly in the level gauge according to an embodiment of the present invention.
Figure 4:
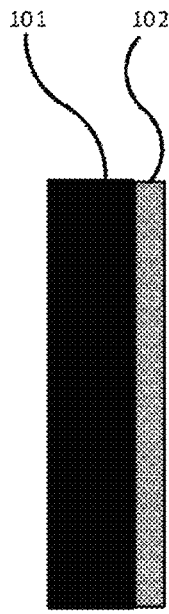
FIG. 4 is a schematic diagram of a magnetic displacement assembly in the level gauge according to an embodiment of the present invention.
Figure 5:
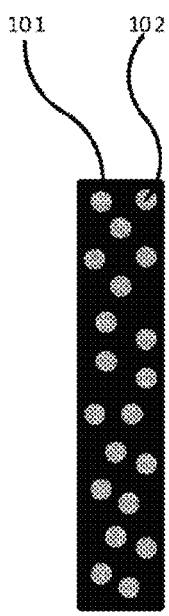
FIG. 5 is a schematic diagram of a magnetic displacement assembly in the level gauge according to an embodiment of the present invention.

As an example, on the basis of the above technical solution, the magnetic displacement assembly 1 as shown in FIG. 1 to FIG. 5 optionally comprises a spring sheet 101 and a permanent magnetic material 102; the permanent magnetic material 102 as shown in FIG. 3 is a permanent magnetic material block and fixed to the surface of a side of the spring sheet 101 facing the magnetic sensor assembly 2; or the permanent magnetic material 102 as shown in FIG. 4 is a permanent magnetic material layer and attached to the surface of a side of the spring sheet 101 facing the magnetic sensor assembly 2; or the permanent magnetic material 102 as shown in FIG. 5 is a permanent magnetic material powder and evenly distributed inside the spring sheet 101; wherein the magnetizing direction of the permanent magnetic material 102 is perpendicular or parallel to the plane where the spring sheet 101 is on, and the magnetoresistive chip 103 is located on the maximum displacement path of the permanent magnetic material 102.

In the present embodiment, the spring sheet 101 is a sheet elastomer, and the material that forms the spring sheet 101 is optionally a metal, ceramics, silicon or a silicon compound, rubber, or a synthetic polymer. It can be appreciated that all sheet elastomers, which are not limited hereto, shall fall within the protection scope of the present invention. The spring sheet 101 of the magnetic level gauge can generate a corresponding mechanical position change under the pressure of the level of the material in the material storage container, that is, generate a displacement. It can be appreciated that the mechanical position change generated by the spring sheet 101 is different for different levels of the material, wherein the direction of the displacement generated by the spring sheet 101 under the action of the material is a direction of the spring sheet 101 pointing to the magnetic sensor assembly 2.

In the present embodiment, the spring sheet 101 is provided with the permanent magnetic material 102 thereon. The permanent magnetic material 102 may be attached to the surface of the spring sheet 101 as a layer, evenly distributed inside the spring sheet 101 as a powder, or attached to the spring sheet 101 as a block. The spring sheet 101 generates the mechanical position change, which in turn drives the permanent magnetic material 102 thereon to generate a mechanical position change, and then the magnetic field between the permanent magnetic material 102 and the magnetoresistive chip 103 changes. According to the relative position relationship between the permanent magnetic material 102 and the spring sheet 101, the permanent magnetic material 102 may be formed on the spring sheet 101 by means of bonding, welding, electroplating, sputtering growth, vapor deposition, or spin coating, so as to form the magnetic displacement assembly 1.

The magnetoresistive chip 103 is located on the maximum displacement path of the permanent magnetic material 102, and then the magnetoresistive chip 103 can sense the magnetic field between the magnetoresistive chip 103 and the permanent magnetic material 102. The magnetic field signal changes along with changes to the relative distance between the magnetoresistive chip 103 and the permanent magnetic material 102.

In the present embodiment, the permanent magnetic material 102 optionally adopts a multi-layer thin-film composite unit made of one hard magnetic material or a variety of hard magnetic materials. In other embodiments, the permanent magnetic material optionally adopts a multi-layer thin-film composite unit of [a soft magnetic material/a hard magnetic material]n, that is, the soft magnetic material layer and the hard magnetic material layer are stacked, wherein n is a natural number, e.g., n=2. Then, the permanent magnetic material optionally has the first layer and the third layer as soft magnetic material layers and the second layer and the fourth layer as hard magnetic material layers. Optionally, the hard magnetic material for making the permanent magnetic material 102 includes, but is not limited to, ferrites, AlNiCo, and rare earth permanent magnets, and the soft magnetic material for making the permanent magnetic material 102 includes, but is not limited to, FeCo, NiFe, silicon steel sheets, and industrial pure iron. It can be appreciated that the hard magnetic material and/or the soft magnetic material that constitute the permanent magnetic material 102 include, but are not limited to, the above examples.

In the present embodiment, the magnetic displacement assembly 1 comprises the spring sheet 101 and the permanent magnetic material 102, and the combination of the spring sheet 101 and the permanent magnetic material 102 converts a material level signal to a mechanical position change to facilitate the subsequent detection of the material level. Specifically, the spring sheet 101 and the permanent magnetic material 102 are composited to work with the highly sensitive magnetoresistive chip 103. The magnetic field close to the magnetoresistive chip 103 changes as a result of the displacement of the spring sheet 101, leading to a change to a magnetic resistance value of the magnetoresistive chip 103, and the processing module 2a converts the mechanical movement to an electric signal, thereby accurately obtaining a signal of the level of the material in the material storage container. Here, the magnetic displacement assembly 1 formed by the spring sheet 101 and the permanent magnetic material 102 has the following advantages: not sensitive to the conductivity of a material, not affected by the dielectric constant of a material, suitable for detection of solid materials, such as blocks and particles, also suitable for detection of liquid materials, and having good adaptability to materials. Meanwhile, the spring sheet 101 has high sensitivity, can be used universally, does not cause a material to be stuck or blocked, does not have power consumption, is resistant to abrasion, and is simple in the overall structure and low in cost.

Figure 6:
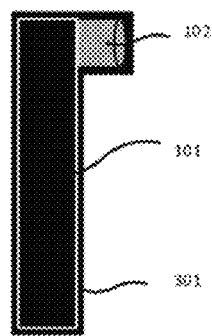
FIG. 6 is a schematic diagram of a magnetic level gauge according to an embodiment of the present invention.

Optionally, the magnetic displacement assembly 1 as shown in FIG. 6 further comprises a protective coating 301 encapsulating the spring sheet 101 and the permanent magnetic material 102. The protective coating 301 can isolate the magnetic displacement assembly 1 from the material, which prevents the magnetic displacement assembly 1 from direct contact with the material, extends the service life of the magnetic displacement assembly 1, reduces the abrasion of the magnetic displacement assembly 1 by the material, and improves the abrasion resistance of the magnetic displacement assembly 1. Optionally, the protective coating 301 may be an abrasion resistant or corrosion resistant polymer material, such as a metal or ceramic material, and may also, in other embodiments, include, but is not limited to, tetrafluoroethylene, titanium, titanium alloys, tungsten alloys, chromium, and aluminum oxide materials, which can prevent the consumption of the spring sheet and the permanent magnetic material by the material.

Optionally, the material storage container comprises a bottom surface (not shown), and the spring sheet 101 as shown in FIG. 7 to FIG. 10 comprises a first end close to the bottom surface of the material storage container and a second end away from the bottom surface of the material storage container; the first end of the spring sheet 101 is fixed to a first fixing point (not shown) via a first support member 109, and the first support member 109 is a rigid support member or an elastic support member; or the first end of the spring sheet 101 is fixed to the first fixing point; wherein the first fixing point is located on the protective housing 108 or located on the side wall 1a of the material storage container.

In the present embodiment, the magnetic level gauge is mounted on the side wall of the material storage container, wherein the spring sheet 101 is a sheet elastomer, the sheet elastomer comprises two ends, one end of the sheet elastomer close to the bottom surface is defined as the first end of the spring sheet 101, and the other end of the sheet elastomer away from the bottom surface is defined as the second end of the spring sheet 101. It can be appreciated that the magnetic level gauge is mounted on the side wall 1a of the material storage container, the first end of the spring sheet 101 essentially refers to the bottom end of the spring sheet 101, and the second end of the spring sheet 101 essentially refers to the top end of the spring sheet 101. One or two ends of the spring sheet 101 are fixed by means of rigid connection or elastic connection, and the fixing point may be located on the surface of the protective housing 108 or on the surface of the side wall 1a of the material storage container.

Optionally, one end of the spring sheet 101 is fixed.

As shown in FIG. 1, the first end of the spring sheet 101 is fixed directly to the side wall 1a of the material storage container.

As shown in FIG. 2, the first end of the spring sheet 101 is fixed to the surface of the protective housing 108 via the first support member 109, and the first support member 109 is optionally a rigid support member.

Figure 7:
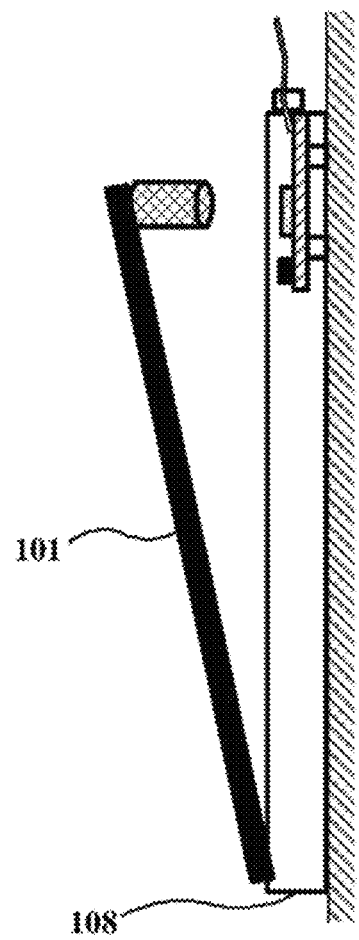
FIG. 7 is a schematic diagram of a magnetic level gauge according to an embodiment of the present invention.

As shown in FIG. 7, the first end of the spring sheet 101 is fixed directly to the surface of the protective housing 108.

Figure 8:
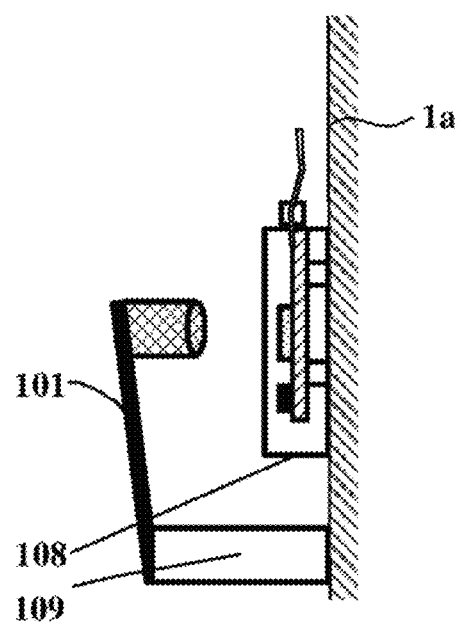
FIG. 8 is a schematic diagram of a magnetic level gauge according to an embodiment of the present invention.

As shown in FIG. 8, the first end of the spring sheet 101 is fixed to the side wall 1a of the material storage container via the first support member 109, and the first support member 109 is optionally a rigid support member.

In other embodiments, the first support member may optionally also be an elastic support member.

Optionally, the second end of the spring sheet 101 is fixed to a second fixing point via a second support member 110, the second support member 110 is a rigid support member or an elastic support member, and the second fixing point is located on the protective housing 108 or located on the side wall 1a of the material storage container.

Optionally, two ends of the spring sheet 101 are fixed.

Figure 9:
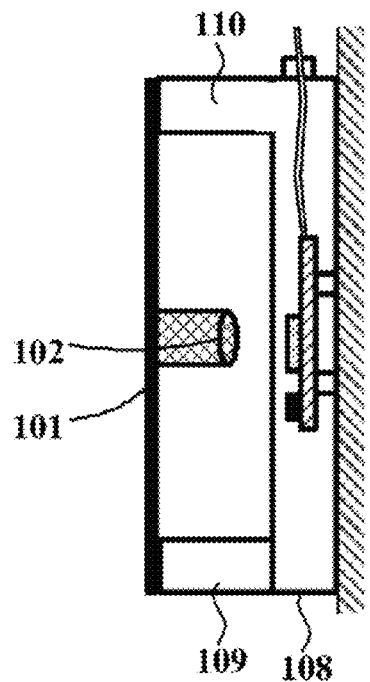
FIG. 9 is a schematic diagram of a magnetic level gauge according to an embodiment of the present invention.

As shown in FIG. 9, the first end of the spring sheet 101 is fixed to the surface of the protective housing 108 via the first support member 109, and the first support member 109 is optionally a rigid support member; the second end of the spring sheet 101 is fixed to the surface of the protective housing 108 via the second support member 110, and the second support member 110 is optionally a rigid support member. It can be appreciated that the permanent magnetic material 102 is located in the middle of the spring sheet 101. At this moment, the bottom end of the spring sheet 101 may be defined as the first end, and the top end of the spring sheet 101 may be defined as the second end.

Figure 10:
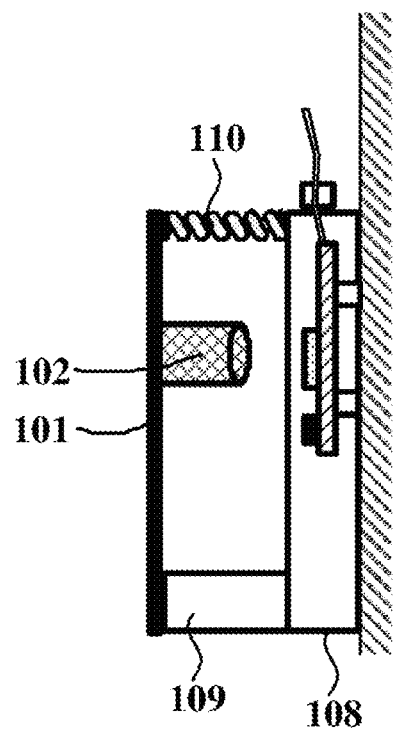
FIG. 10 is a schematic diagram of a magnetic level gauge according to an embodiment of the present invention.

As shown in FIG. 10, the first end of the spring sheet 101 is fixed to the surface of the protective housing 108 via the first support member 109, and the first support member 109 is optionally a rigid support member; the second end of the spring sheet 101 is fixed to the surface of the protective housing 108 via the second support member 110, and the second support member 110 is optionally an elastic support member.

Optionally, the surface of a side of the protective housing 108 away from the magnetic displacement assembly 1 is attached and fixed to the side wall 1a of the material storage container, and the surface of a side of the protective housing 108 facing the magnetic displacement assembly 1 is a flat surface or an arc surface.

Figure 11:
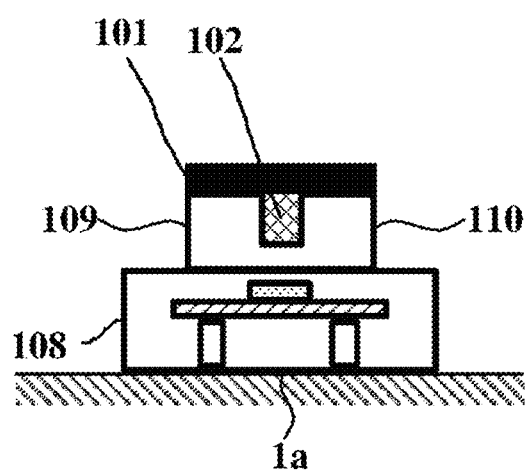
FIG. 11 is a schematic diagram of a magnetic level gauge according to an embodiment of the present invention.

As shown in FIG. 11, optionally, the side wall 1a of the material storage container is a flat surface, the surface of a side of the protective housing 108 facing the magnetic displacement assembly 1 is a flat surface, and the surface of a side of the protective housing 108 away from the magnetic displacement assembly 1 is attached and fixed to the side wall 1a of the material storage container.

Figure 12:
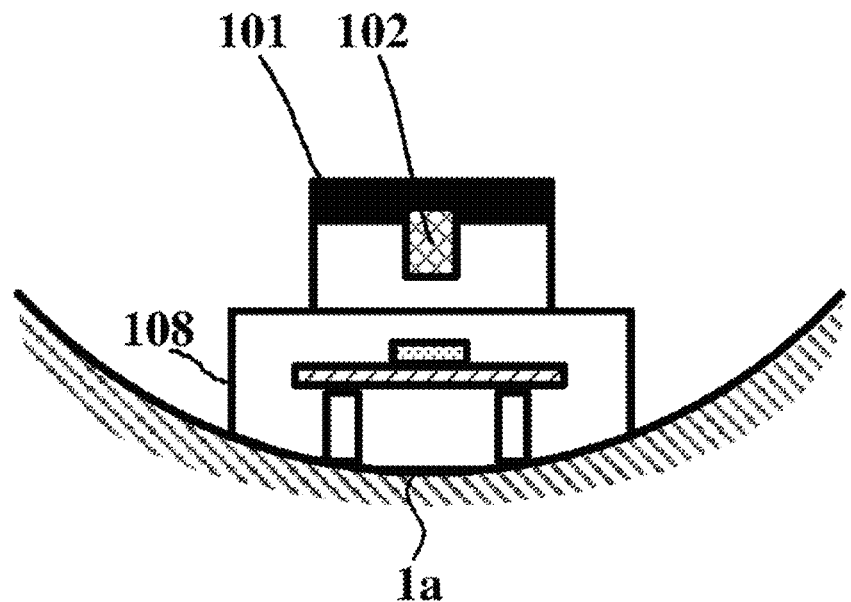
FIG. 12 is a schematic diagram of a magnetic level gauge according to an embodiment of the present invention.

As shown in FIG. 12, optionally, the side wall 1a of the material storage container is an arc surface, the surface of a side of the protective housing 108 facing the magnetic displacement assembly 1 is a flat surface, and the surface of a side of the protective housing 108 away from the magnetic displacement assembly 1 is adaptively attached and fixed to the side wall 1a of the material storage container.

Figure 13:
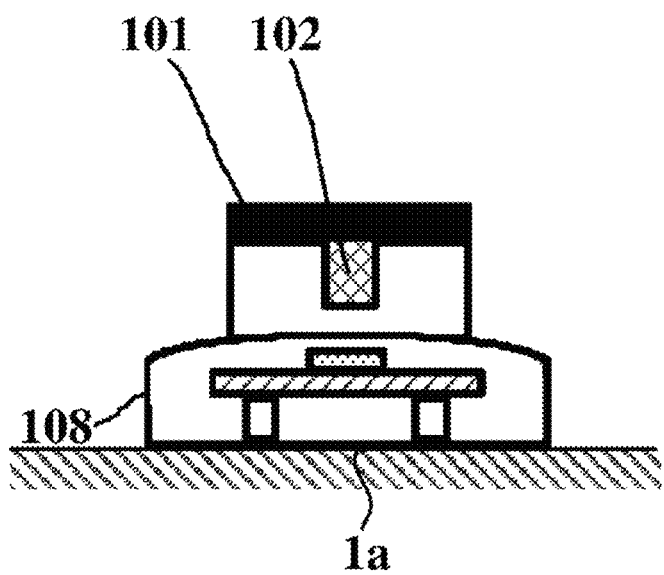
FIG. 13 is a schematic diagram of a magnetic level gauge according to an embodiment of the present invention.

As shown in FIG. 13, optionally, the side wall 1a of the material storage container is a flat surface, the surface of a side of the protective housing 108 facing the spring sheet 101 is an arc surface, and the magnetic displacement assembly 1 is in fixed connection with the protective housing 108 having an arc surface.

It should be noted that the design of the top arc surface of the protective housing 108 is favorable for reducing the mechanical impact and abrasion to the protective housing 108 by the material, and the selection of the bottom arc surface and bottom flat surface of the protective housing 108 to have the same radian as the mounting position realizes the maximized fitting between the protective housing 108 and the mounting position, which reduces the stress and at the same time, improves the stability.

Figure 14:
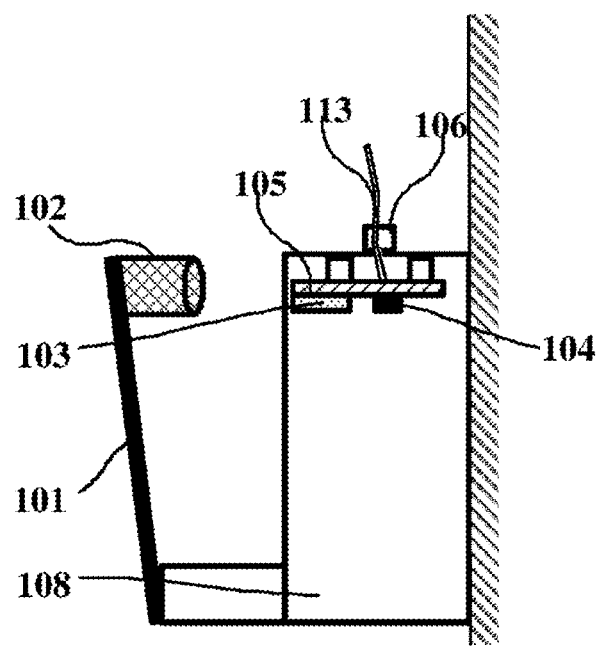
FIG. 14 is a schematic diagram of a magnetic level gauge according to an embodiment of the present invention.

As an example, on the basis of the above technical solution, the processing module 2a as shown in FIG. 2 and FIG. 14 optionally comprises a signal processing unit 104 and a circuit board 105, wherein the circuit board 105 is fixed inside the protective housing 108, the magnetoresistive chip 103 is arranged on the surface of a side of the circuit board 105 facing the magnetic displacement assembly 1, and the signal processing unit 104 is arranged on the surface of a side of the circuit board 105; the magnetoresistive chip 103 is used to sense a magnetic field signal of the magnetic displacement assembly 1; and the signal processing unit 104 is used to obtain the magnetic field signal, determine the level of the material in the material storage container according to the magnetic field signal, and then output a level signal of the material. The processing module 2a in FIG. 1 to FIG. 13 has the same structure as that in FIG. 2 and FIG. 14, which will not be specifically repeated and marked herein.

The top surface of the protective housing 108 specifically refers to the surface of a side of the protective housing 108 away from the side wall 1a. As shown in FIG. 1 to FIG. 13, the plane where the magnetoresistive chip 1 is on is parallel to the tangent plane at the highest point of the top surface of the protective housing 108, the sensitive direction of the magnetoresistive chip 103 is located on the plane where the magnetoresistive chip 103 is on, and the sensitive direction of the magnetoresistive chip 103 is parallel to the tangent plane at the highest point of the top surface of the protective housing 108. As shown in FIG. 14, the plane where the magnetoresistive chip 1 is on is perpendicular to the tangent plane at the highest point of the top surface of the protective housing 108, the sensitive direction of the magnetoresistive chip 103 is located on the plane where the magnetoresistive chip 103 is on, and the sensitive direction of the magnetoresistive chip 103 is parallel or perpendicular to the tangent plane at the highest point of the top surface of the protective housing 108.

In the present embodiment, the circuit board 105 is optionally a PCB circuit board, and the circuit board 105 is fixed inside the protective housing 108 by means of a support column. Alternatively, in other embodiments, the PCB circuit board may be directly fixed to an inner wall of the protective housing. The magnetoresistive chip 103 and the signal processing unit 104 are integrated on the PCB circuit board, and the magnetoresistive chip 103 is further located inside the perpendicular projection of the permanent magnetic material 102 on its maximum displacement path.

Optionally, the magnetoresistive chip 103 is any one of an anisotropic magnetoresistive chip, a giant magnetoresistive chip, and a tunnel junction magnetoresistive chip. The magnetoresistive chip 103 may sense a magnetic field signal of the permanent magnetic material 102, convert the magnetic field signal into a magnetoresistive signal, and transmit the same to the signal processing unit 104, and the signal processing unit 104 analyzes and processes the magnetoresistive signal and outputs a result.

Optionally, the signal processing unit 104 is one or more of integrated circuit chips, such as CPU, MCU, DSP, ASIC, amplifiers, filters, and comparators, or the signal processing unit 104 may be a circuit on a PCB circuit board comprising discrete devices and having the same functions as the above elements. The signal processing unit 104 has one or more of the following functions: receiving, via the circuit board 105, a magnetoresistive signal generated by the magnetoresistive chip 103, performing modulation, filtering, amplification, analog to digital conversion, isolation, noise reduction, level switch, and output form conversion, and transmitting the processed signal to a data transmission unit 111. It can be appreciated that the signal processing unit 104 and the magnetoresistive chip 103 may be located within the same encapsulation or may be independently encapsulated.

Figure 15:
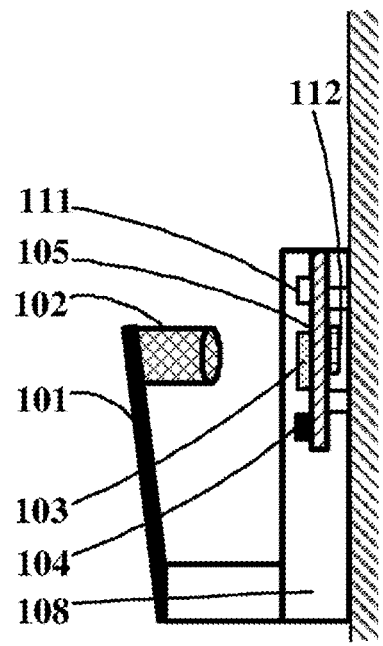
FIG. 15 is a schematic diagram of a magnetic level gauge according to an embodiment of the present invention.

Optionally, the circuit board 105 as shown in FIG. 15 is further provided with a power supply unit 112 and the data transmission unit 111.

The data transmission unit 111 transmits at least one of the signal generated by the magnetoresistive chip 103 and the signal generated by the signal processing unit 104 to an external terminal, wherein the data transmission unit 111 performs transmission in a wireless transmission or a wired transmission manner. If the data transmission unit 111 performs transmission in a wireless transmission manner, a wireless transmission unit is further integrated on the circuit board 105, and the wireless transmission unit transmits data of the data transmission unit 111 to an external interrupt in a wireless transmission manner. It can be appreciated that the data transmission unit 111 and the signal processing unit 104 may be located within the same encapsulation or may be independently encapsulated.

The power supply unit 112 supplies power to all power-consuming elements in the level gauge, for example, supplies power to the magnetoresistive chip 103, the signal processing unit 104, the circuit board 105, and the data transmission unit 111. The power supply unit 112 supplies power by means of an internal battery and/or external wires, wherein the internal battery is arranged inside the protective housing 108, and the external wires are connected to the PCB circuit board through a sealed port on the surface of the protective housing 108.

In other embodiments, the data transmission unit and the power supply unit may also be optionally fixed to an inner wall of the protective housing.

As shown in FIG. 14, if the data transmission unit (not shown, but integrated in the circuit board 105) performs transmission in a wired transmission manner, the magnetic sensor assembly 2 further comprises a transmission wire 113. The transmission wire 113 is electrically connected with an external terminal, a sealed port 106 is further arranged on the protective housing 108 at the position of connection with the transmission wire 113, and the transmission wire 113 is electrically connected with the PCB circuit board through the sealed port 106 on the surface of the protective housing 108, wherein the sealed port 106 may realize sealing and water-proof functions, and in this way, solid and liquid materials can be prevented from entering the protective housing 108 through the connection position of the protective housing 108 and the transmission wire 113 to damage the magnetic sensor assembly 2. It should be noted that the transmission wire 106 further extends onto the PCB circuit board and transmits power supply signals and other signals to all the devices.

Based on the example above, the circuit principle of the level gauge based on magnetic sensor functions is as follows: the power supply unit supplies power to all power-consuming devices; the magnetoresistive chip converts a magnetic field change caused by the displacement of the permanent magnetic material on the spring sheet into an electrical signal, and outputs the signal via the PCB circuit board to the signal processing unit, wherein the signal output by the magnetoresistive chip is output in a single-end output or differential output manner; the signal processing unit conditions the signal, outputs a current or voltage signal as needed, or outputs an analog or digital signal as needed, and then outputs the signal via the data transmission unit to an external terminal, thereby determining the level of the material in the material storage container.

Figure 16:
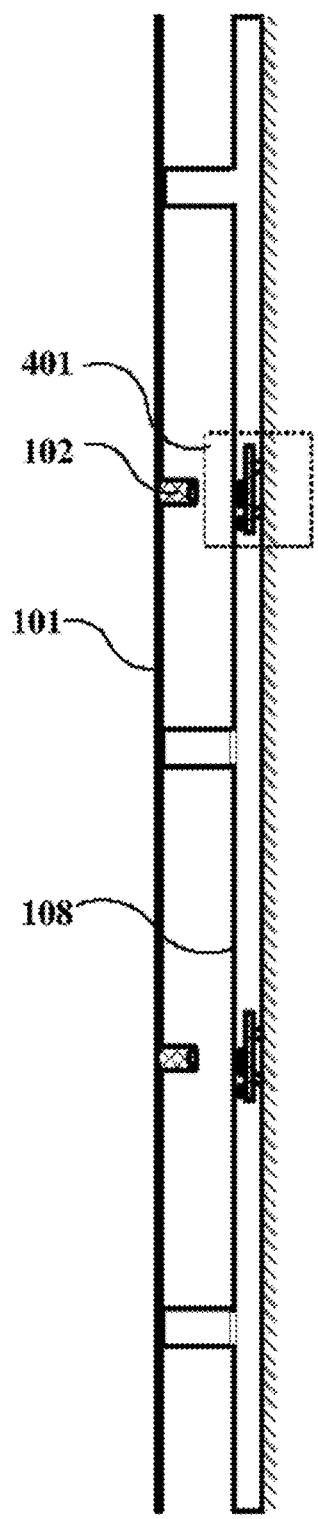
FIG. 16 is a schematic diagram of a magnetic level gauge according to an embodiment of the present invention.
Figure 17:
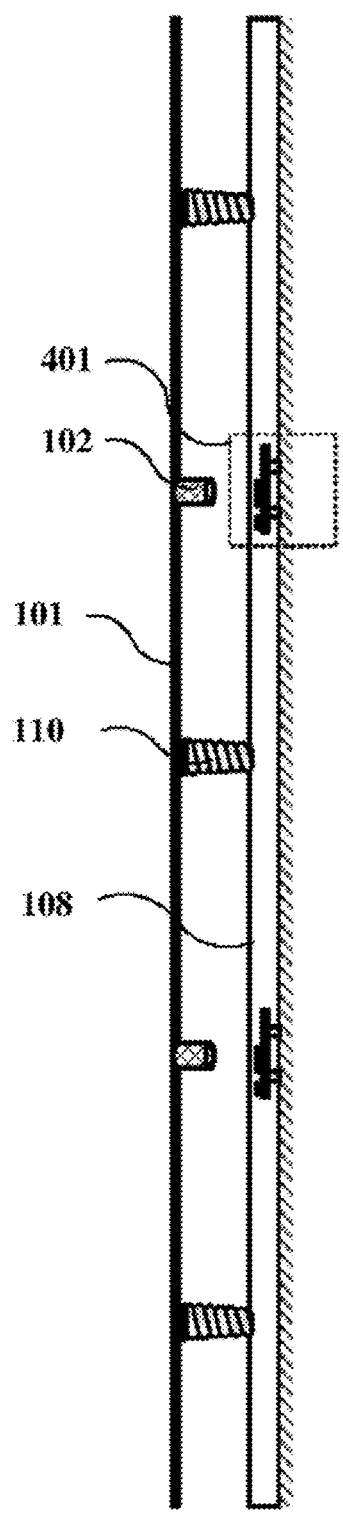
FIG. 17 is a schematic diagram of a magnetic level gauge according to an embodiment of the present invention.

As an example, on the basis of the above technical solution, the magnetoresistive chip 103, the signal processing unit 104, and the circuit board 105 as shown in FIG. 16 and FIG. 17 optionally form a magnetic sensor measurement basic unit 401 of the magnetic sensor assembly, and a plurality of magnetic sensor measurement basic units 401 may be arranged in a linear arrangement manner inside the protective housing 108 to work with the linear spring sheet and the permanent magnetic material, which can be used for accurate measurement of different material levels.

In the present embodiment, the plurality of magnetic sensor measurement basic units 401 may share one spring sheet, the extending direction of the spring sheet is parallel to the direction from the bottom surface of the material storage container to the top surface of the material storage container, and the plurality of magnetic sensor measurement basic units 401 are sequentially arranged on the extending direction of the spring sheet. The plurality of magnetic sensor measurement basic units 401 are connected to each other via the PCB circuit board 105 or the transmission wire 106, and the plurality of magnetic sensor measurement basic units 401 transmit signals to the outside of the protective housing 108 via the transmission wire 106. Specifically, each of the magnetic sensor measurement basic units 401 comprises one or more data transmission units and transmits signals to the outside of the protective housing 108. The plurality of magnetic sensor measurement basic units 401 are also powered via the transmission wire 106, or one or more power supply units are provided inside magnetic sensor measurement basic units 401 to realize self power supply.

It should be noted that the foregoing descriptions are merely preferred embodiments and employed technical principles of the present invention. Those skilled in the art should appreciate that the present invention is not limited to the specific embodiments described herein. Various obvious changes, re-adjustments, mutual combinations, and substitutions may be made by those skilled in the art without departing from the protection scope of the present invention. Therefore, although the present invention is described in detail through the above embodiments, the present invention is not limited only to the above embodiments. More other equivalent embodiments may be further encompassed without departing from the concept of the present invention, while the scope of the present invention shall be subject to the scope of the appended claims.

The invention claimed is:

1. A magnetic level gauge mounted on a side wall of a material storage container, the magnetic level gauge comprising:
   a magnetic displacement assembly, wherein the magnetic displacement assembly includes a spring sheet and a permanent magnetic material; and
   a magnetic sensor assembly, comprising a protective housing, a magnetoresistive chip and a processing module that are located within the protective housing, wherein the protective housing is fixed on the side wall of the material storage container, the magnetoresistive chip is located at a side of the processing module facing the magnetic displacement assembly, and the magnetic sensor assembly is used to sense a magnetic field signal generated by the permanent magnetic material,
   wherein the spring sheet of the magnetic displacement assembly has an elastic property and is configured to be mechanically displaced to move the permanent magnetic material toward the magnetic sensor assembly mounted on the side wall of the material storage container as a level of material within the material storage container increases, different levels of material correspond to different mechanical displacement of the permanent magnetic material, and the magnetic displacement assembly is configured to determine the level of the material in the material storage container based on the sensed magnetic field signal.

2. The magnetic level gauge according to claim 1, wherein:
   the permanent magnetic material is a permanent magnetic material block and fixed to a surface of a side of the spring sheet facing the magnetic sensor assembly; or
   the permanent magnetic material is a permanent magnetic material layer and attached to the surface of a side of the spring sheet facing the magnetic sensor assembly; or
   the permanent magnetic material is a permanent magnetic material powder and evenly distributed inside the spring sheet;
   wherein a magnetizing direction of the permanent magnetic material is perpendicular or parallel to a plane where the spring sheet is on, and the magnetoresistive chip is located on a displacement path of the permanent magnetic material.

3. The magnetic level gauge according to claim 2, wherein the permanent magnetic material adopts a multi-layer thin-film composite unit formed by one hard magnetic material or a variety of hard magnetic materials; or
   the permanent magnetic material adopts a multi-layer thin-film composite material of a soft magnetic material/a hard magnetic material n, wherein n is a natural number.

4. The magnetic level gauge according to claim 2, wherein the magnetic displacement assembly further comprises a protective coating encapsulating the spring sheet and the permanent magnetic material.

5. The magnetic level gauge according to claim 2, wherein the material storage container comprises a bottom surface, and the spring sheet comprises a first end toward the bottom surface of the material storage container and a second end away from the bottom surface of the material storage container;
   the first end of the spring sheet is fixed to a first fixing point via a first support member, and the first support member is a rigid support member or an elastic support member; or the first end of the spring sheet is fixed to the first fixing point; wherein the first fixing point is located on the protective housing or located on a side wall of the material storage container.

6. The magnetic level gauge according to claim 5, wherein the second end of the spring sheet is fixed to a second fixing point via a second support member, the second support member is a rigid support member or an elastic support member, and the second fixing point is located on the protective housing or located on a side wall of the material storage container.

7. The magnetic level gauge according to claim 1, wherein the processing module comprises a signal processing unit and a circuit board, wherein the circuit board is fixed inside the protective housing, the magnetoresistive chip is arranged on a surface of a side of the circuit board facing the magnetic displacement assembly, and the signal processing unit is arranged on the surface of a side of the circuit board;
   the magnetoresistive chip is used to sense a magnetic field signal of the magnetic displacement assembly; and
   the signal processing unit is used to obtain the magnetic field signal, determine the level of the material in the material storage container according to the magnetic field signal, and then output a level signal of the material.

8. The magnetic level gauge according to claim 1, wherein a plane where the magnetoresistive chip is on is perpendicular to a tangent plane at a highest point of a top surface of the protective housing, a sensitive direction of the magnetoresistive chip is located on the plane where the magnetoresistive chip is on, and the sensitive direction of the magnetoresistive chip is parallel or perpendicular to the tangent plane at the highest point of the top surface of the protective housing; or
   the plane where the magnetoresistive chip is on is parallel to the tangent plane at the highest point of the top surface of the protective housing, the sensitive direction of the magnetoresistive chip is located on the plane where the magnetoresistive chip is on, and the sensitive direction of the magnetoresistive chip is parallel to the tangent plane at the highest point of the top surface of the protective housing.

9. The magnetic level gauge according to claim 1, wherein the magnetoresistive chip is any one of an anisotropic magnetoresistive chip, a giant magnetoresistive chip, and a tunnel junction magnetoresistive chip.

10. A magnetic level gauge mounted on a side wall of a material storage container, the magnetic level gauge comprising:
    a magnetic displacement assembly, which is used to generate a mechanical displacement to the side wall of the material storage container in response to the level of a material in the material storage container; and
    a magnetic sensor assembly, comprising a protective housing, a magnetoresistive chip and a processing module that are located within the protective housing, wherein the protective housing is fixed on the side wall of the material storage container, the magnetoresistive chip is located at a side of the processing module facing the magnetic displacement assembly, and the magnetic sensor assembly is used to sense a magnetic field signal generated by a permanent magnetic material,
    wherein the magnetic displacement assembly comprises a spring sheet and the permanent magnetic material;
    wherein the spring sheet of the magnetic displacement assembly has an elastic property and is configured to mechanically displace the permanent magnetic material toward the magnetic sensor assembly mounted on the side wall of the material storage container as a level of material within the material storage container increases, different levels of material correspond to different mechanical displacement of the permanent magnetic material, and the magnetic displacement assembly is configured to determine the level of the material in the material storage container based on the sensed magnetic field signal, the permanent magnetic material is a permanent magnetic material block and fixed to a surface of a side of the spring sheet facing the magnetic sensor assembly; or the permanent magnetic material is a permanent magnetic material layer and attached to a surface of the side of the spring sheet facing the magnetic sensor assembly; or the permanent magnetic material is a permanent magnetic material powder and evenly distributed inside the spring sheet;

wherein a magnetizing direction of the permanent magnetic material is perpendicular or parallel to a plane where the spring sheet is on, and the magnetoresistive chip is located on a maximum displacement path of the permanent magnetic material, wherein the material storage container comprises a bottom surface, and the spring sheet comprises a first end close to the bottom surface of the material storage container and a second end away from the bottom surface of the material storage container; the first end of the spring sheet is fixed to a first fixing point via a first support member, and the first support member is a rigid support member or an elastic support member; or the first end of the spring sheet is fixed to the first fixing point; wherein the first fixing point is located on the protective housing or located on a side wall of the material storage container, and wherein the second end of the spring sheet is fixed to a second fixing point via a second support member, the second support member is a rigid support member or an elastic support member, and the second fixing point is located on the protective housing or located on a side wall of the material storage container.

* * * * *